United States Patent
Sato et al.

(10) Patent No.: US 9,749,505 B2
(45) Date of Patent: Aug. 29, 2017

(54) SOLID-STATE IMAGING DEVICE AND CONTROL SYSTEM

(71) Applicant: Sony Corporation, Tokyo (JP)

(72) Inventors: Maki Sato, Kanagawa (JP); Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/253,576

(22) Filed: Apr. 15, 2014

(65) Prior Publication Data

US 2014/0226051 A1 Aug. 14, 2014

Related U.S. Application Data

(62) Division of application No. 11/879,444, filed on Jul. 17, 2007.

(30) Foreign Application Priority Data

Jul. 20, 2006 (JP) ................. 2006-198635

(51) Int. Cl.

| | | |
|---|---|---|
| *H01L 31/113* | (2006.01) | |
| *H04N 5/351* | (2011.01) | |
| *H04N 5/217* | (2011.01) | |
| *H04N 3/14* | (2006.01) | |
| *H04N 5/359* | (2011.01) | |
| *H04N 5/235* | (2006.01) | |
| *H01L 27/146* | (2006.01) | |

(52) U.S. Cl.
CPC ......... *H04N 5/2175* (2013.01); *H04N 3/1568* (2013.01); *H04N 5/2351* (2013.01); *H04N 5/351* (2013.01); *H04N 5/3591* (2013.01); *H01L 27/14654* (2013.01)

(58) Field of Classification Search
CPC ..... H01L 31/113; H01L 27/148; H01L 31/18; H01L 27/14812; H04N 5/232; H04N 9/045

See application file for complete search history.

(56) References Cited

U.S. PATENT DOCUMENTS

| | | | | |
|---|---|---|---|---|
| 3,934,161 | A * | 1/1976 | Caywood | 327/515 |
| 4,306,785 | A * | 12/1981 | Tano et al. | 396/229 |
| 4,977,312 | A * | 12/1990 | Juen | 250/208.1 |
| 4,989,093 | A * | 1/1991 | Kaneko | 348/224.1 |
| 5,751,354 | A * | 5/1998 | Suzuki et al. | 348/349 |
| 5,978,024 | A | 11/1999 | Lee | |
| 6,452,633 | B1 * | 9/2002 | Merrill et al. | 348/302 |
| 6,768,784 | B1 * | 7/2004 | Green et al. | 378/62 |

(Continued)

FOREIGN PATENT DOCUMENTS

| | | | |
|---|---|---|---|
| JP | 62-023156 | | 1/1987 |
| JP | 03077486 | * | 4/1991 |

(Continued)

*Primary Examiner* — Fazli Erdem
(74) *Attorney, Agent, or Firm* — Chip Law Group

(57) ABSTRACT

A solid-state imaging device is provided. The solid-state imaging device includes an imaging region having a plurality of pixels arranged on a semiconductor substrate, in which each of the pixels includes a photoelectric converting portion and a charge converting portion for converting a charge generated by photoelectric conversion into a pixel signal and blooming is suppressed by controlling a substrate voltage of the semiconductor substrate.

8 Claims, 7 Drawing Sheets

(56) References Cited

U.S. PATENT DOCUMENTS

| | | | |
|---|---|---|---|
| 6,778,214 B1 | 8/2004 | Toma | |
| 6,856,352 B1* | 2/2005 | Kijima | 348/312 |
| 7,141,774 B2* | 11/2006 | Yuyama | 250/208.1 |
| 7,292,274 B2* | 11/2007 | Nakamura | 348/272 |
| 7,365,785 B2* | 4/2008 | Hashimoto et al. | 348/314 |
| 7,929,856 B2* | 4/2011 | Chen | 396/247 |
| 2001/0038064 A1* | 11/2001 | Mori et al. | 250/208.1 |
| 2002/0171752 A1* | 11/2002 | Baer | H04N 5/2353 348/362 |
| 2003/0086005 A1* | 5/2003 | Nakamura | 348/223.1 |
| 2003/0214600 A1* | 11/2003 | Kido | H04N 5/235 348/362 |
| 2004/0165103 A1* | 8/2004 | Hashimoto et al. | 348/372 |
| 2004/0211885 A1* | 10/2004 | Kohno et al. | 250/214.1 |
| 2004/0239790 A1* | 12/2004 | Maeda | H04N 5/23245 348/311 |
| 2004/0262495 A1* | 12/2004 | Yuyama | 250/208.1 |
| 2005/0083419 A1* | 4/2005 | Honda et al. | 348/244 |
| 2005/0083421 A1* | 4/2005 | Berezin et al. | 348/308 |
| 2005/0117041 A1 | 6/2005 | Tsukamoto | |
| 2005/0151874 A1* | 7/2005 | Shiraishi | 348/348 |
| 2005/0179144 A1* | 8/2005 | Hori | H01L 27/14621 250/370.11 |
| 2005/0206760 A1* | 9/2005 | Higashitsutsumi | 348/294 |
| 2006/0022223 A1 | 2/2006 | Kumesawa | |
| 2006/0291849 A1* | 12/2006 | Shamir et al. | 396/334 |
| 2007/0003261 A1* | 1/2007 | Yamasaki | 396/55 |
| 2007/0023785 A1* | 2/2007 | Hasuka | H04N 5/335 257/215 |
| 2007/0080905 A1 | 4/2007 | Takahara | |
| 2008/0036856 A1* | 2/2008 | Yamada et al. | 348/72 |
| 2008/0049133 A1* | 2/2008 | Bock | 348/317 |
| 2008/0218598 A1* | 9/2008 | Harada et al. | 348/222.1 |
| 2009/0169195 A1* | 7/2009 | Chen | 396/246 |
| 2009/0231364 A1* | 9/2009 | Tsai | 345/690 |
| 2009/0284502 A1 | 11/2009 | Hayafuji | |
| 2010/0141819 A1* | 6/2010 | Fowler et al. | 348/302 |
| 2011/0080497 A1* | 4/2011 | Ejima et al. | 348/222.1 |
| 2011/0253882 A1* | 10/2011 | Kumesawa | H01L 27/14601 250/208.1 |
| 2012/0235021 A1* | 9/2012 | Kasai | 250/208.1 |

FOREIGN PATENT DOCUMENTS

| | | | |
|---|---|---|---|
| JP | 09-139486 | | 5/1997 |
| JP | 11-150680 | | 6/1999 |
| JP | 2003-153084 | | 5/2003 |
| JP | 2003142677 | * | 5/2003 |
| JP | 2003-142677 | | 6/2003 |
| JP | 2003-218344 | | 7/2003 |
| JP | 2004-147208 | | 5/2004 |
| JP | 2004-221339 | | 8/2004 |
| JP | 2005-311733 | | 11/2005 |
| JP | 2006-108379 | | 4/2006 |
| JP | 2006-147758 | | 6/2006 |

* cited by examiner

SOLID-STATE IMAGING DEVICE AND CONTROL SYSTEM

CROSS REFERENCES TO RELATED APPLICATIONS

The subject matter of application Ser. No. 11/879,444, is incorporated herein by reference. The present application is a Divisional of U.S. Ser. No. 11/879,444, filed Jul. 17, 2007, which claims priority to Japanese Patent Application JP 2006-198635 filed in the Japanese Patent Office on Jul. 20, 2006, the entire contents of which being incorporated herein by reference.

BACKGROUND OF THE INVENTION

Field of the Invention

The present invention relates to a solid-state imaging device capable of suppressing blooming and a control system. Particularly, the present invention relates to a solid-state imaging device such as a CMOS sensor that includes pixels each having a charge converting portion for converting a charge generated by photoelectric conversion into a pixel signal. The term "CMOS image sensor" used herein refers to as an image sensor produced by the application of or partially using the CMOS process. The solid-state imaging device may be formed of a single chip or a plurality of chips.

Description of the Related Art

CMOS image sensors and CCD image sensors have been known as solid-state imaging devices. Blooming has been a typical problem upon producing solid-state imaging devices. Blooming should be suppressed in solid-state imaging devices due to the reason of causing color mixture and color blur. In the case of a CMOS sensor, an overflowed charge leaks into an adjacent pixel to cause blooming and in the case of a CCD sensor, an overflowed charge flows from a photodiode that is a photoelectric converting portion into a vertical transfer register to cause vertical ghost lines.

In particular, when a difference between a bright portion and a dark portion is large in an image such as a starlit sky image captured with a night scene mode (subject including a bright spot in the darkness) or when a difference between a bright portion and a dark portion is large in an image including, for example, a dark spot in the bright portion with high intensity of light, such images may be unclear. Hence blooming should be suppressed.

In order to suppress blooming caused when an amount of charge is saturated (Qssat), there is typically proposed a method of changing a charge accumulation time in response to an amount of received light. In addition, there is known a method of changing an overflow potential barrier (hereinafter referred to as an "overflow barrier") by controlling a substrate voltage. In the case where such overflow barrier is changed, there are two kinds of methods employed for accumulating more charges, that is, raising an amount of charge saturated (Qssat). Japanese Unexamined Patent Application Publication No. 2003-153084 and Japanese Unexamined Patent Application Publication No. 9-139486 disclose a method of lowering a substrate power supply (voltage) to raise an overflow barrier. With another method, the substrate power supply (voltage) is increased by reducing an overflow barrier in the depth direction of the substrate so that redundant charges be discharged to the substrate.

A method of suppressing blooming by controlling a substrate voltage is proposed for CCD sensors. CCD sensors use a high power supply voltage (not less than 10V), and hence the method of lowering a substrate power supply voltage to raise an overflow barrier is efficient.

On the other hand, for CMOS sensors, there is proposed a method of suppressing blooming by controlling impurities of a semiconductor well region (i.e., sensor well region) formed on a semiconductor substrate while a substrate voltage is constant to set an overflow barrier.

SUMMARY OF THE INVENTION

In an operating system of CMOS sensors, an electronic shutter (to discharge electronic charges to the substrate) that controls a substrate voltage for the whole pixels at a time may not be used.

As described above, in the case of a CMOS sensor, overflowed charges may leak into an adjacent pixel to cause blooming. Specifically, in the CMOS sensor, it is originally desired to discharge charges overflowed from a photodiode to a semiconductor substrate, that is, to discharge charge overflowed from the photodiode to the semiconductor substrate over a well region formed below the photodiode. However, a difference between an overflow barrier in a depth direction of the substrate and that in a lateral direction is rarely large enough so that actually, charges frequently overflow through a well region in a lateral direction to leak into an adjacent pixel to cause blooming.

It is desirable to provide a CMOS solid-state imaging device in which redundant charges may be discharged readily in the thickness direction of the semiconductor substrate to suppress blooming and a system for controlling a substrate voltage of the solid-state imaging device.

According to an embodiment of the present invention, there is provided a solid-state imaging device having an imaging region including a plurality of pixels arranged on a semiconductor substrate. Each of the pixels includes a photoelectric converting portion and a charge converting portion for converting a charge generated by photoelectric conversion into a pixel signal and a substrate voltage of the semiconductor substrate is controlled to suppress blooming.

In the solid-state imaging device according to the embodiment of the present invention, the substrate voltage is controlled to reduce an overflow barrier, thereby controlling blooming. At that time, charges accumulated in the photoelectric converting portion are not discharged. Accordingly, the change in the substrate voltage may not affect the accumulated charges.

According to another embodiment of the present invention, there is provided a solid-state imaging device having an imaging region including a plurality of pixels arranged on a semiconductor substrate, in which each of the pixels includes a photoelectric converting portion and a charge converting portion for converting a charge generated by photoelectric conversion into a pixel signal. A substrate voltage of the semiconductor substrate is increased over an initial setting voltage to control an overflow barrier to be reduced in response to luminance when an image of a dark subject is captured.

The initial setting voltage of the semiconductor substrate is supplied from the same power supply as a CMOS analog/logic power supply that drives peripheral analog and digital circuits.

In the solid-state imaging device according to the embodiment of the present invention, the substrate voltage is increased to be higher than the initial setting voltage in response to brightness of a subject and to reduce the overflow barrier when an image of a dark subject is captured. Accordingly, blooming can be suppressed even if a bright spot exists in a field.

According to further another embodiment of the present invention, there is provided a solid-state imaging device having an imaging region including a plurality of pixels arranged on a semiconductor substrate. Each of the pixel includes a photoelectric converting portion and a charge converting portion for converting a charge generated by photoelectric conversion into a pixel signal. A substrate voltage of the semiconductor substrate is increased to control an overflow barrier to be reduced in response to brightness of a subject.

In the solid-state imaging device according to the embodiment of the present invention, the substrate voltage is increased to control the overflow barrier to be reduced in response to brightness (bright/dark) of a subject, thereby suppressing blooming.

According to yet another embodiment of the present invention, there is provided a system for controlling a substrate voltage of a solid-state imaging device. The system includes: the solid-state imaging device, an image processing device configured to process a signal output from the solid-state imaging device, a determination device configured to determine brightness of a subject based on a signal output from the solid-state imaging device, and a substrate voltage control device configured to control the substrate voltage based on the determination result from the determination device. The system controls the substrate voltage of the solid-state imaging device based on a control signal supplied from the substrate voltage control device in response to brightness of a subject.

In the control system according to the embodiment of the present invention, brightness of the subject is determined and the substrate voltage of the solid-state imaging device is automatically controlled by the control signal from the substrate voltage control device based on the determination result. The overflow barrier is reduced by controlling the substrate voltage, thereby suppressing blooming.

According to the embodiments of the solid-state imaging device, blooming can be suppressed efficiently in a CMOS solid-state imaging device.

According to the embodiment of the control system, blooming can be suppressed automatically in response to brightness of a subject in the control system including a CMOS solid-state imaging device.

DESCRIPTION OF THE PREFERRED EMBODIMENTS

According to embodiments of the present invention, a system that includes a substrate voltage control circuit is provided. Further, according to embodiments of the present invention, brightness (bright/dark) is determined by an automatic exposure time detector (hereinafter referred to as an "AE (Automatic Exposure)"). Upon adjusting the exposure time, if it is determined that a mean output is low and that the subject is dark, then a substrate power supply voltage is uniformly increased using the substrate voltage control circuit to reduce an overflow barrier. If it is determined that an amount of light is large, then when an amount of charge (for example, the number of electrons) is saturated, the substrate power supply voltage is increased using the substrate voltage control circuit to reduce an overflow barrier. Alternatively, according to an embodiment of the present invention, the substrate voltage is increased using the substrate voltage control circuit depending on a selected mode to reduce the overflow barrier.

The embodiments of the present invention will hereinafter be described in detail with reference to the drawings.

Figure 1:
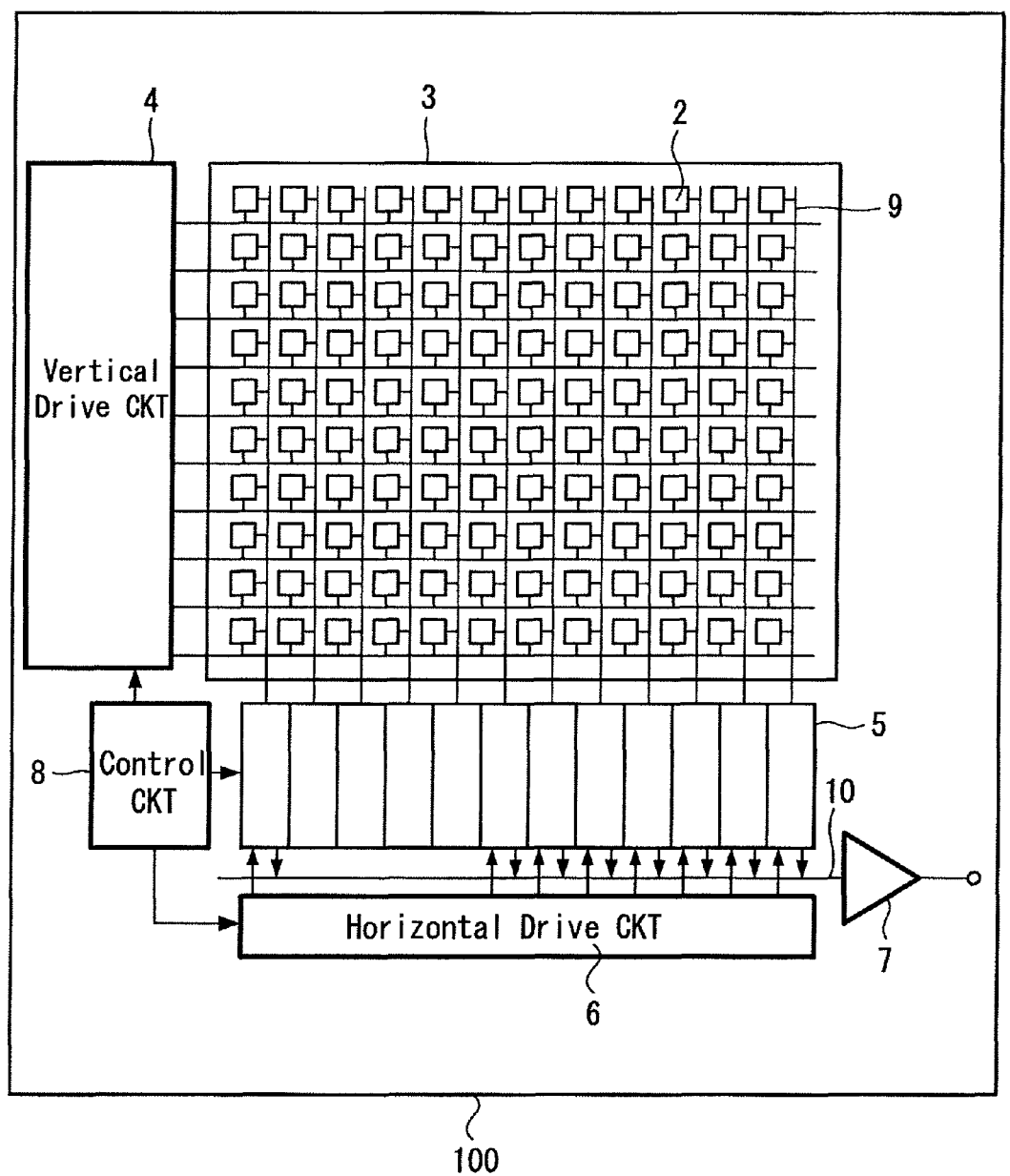
FIG. 1 is a schematic diagram showing a solid-state imaging device according to an embodiment of the present invention.

FIG. 1 illustrates a schematic configuration of a CMOS solid-state imaging device (image sensor) as an embodiment of the solid-state imaging device of the present invention. A solid-state imaging device 1 according to the embodiment includes: an imaging region 3 in which a plurality of pixels 2 each having a photoelectric converting portion is regularly arranged in a two dimensional array; and a vertical drive circuit 4, a column signal-processing circuit 5, a horizontal drive circuit 6, an output circuit 7, a control circuit 8 and the like provided as peripheral circuits of the imaging region 3 on a semiconductor substrate, for example, a silicon substrate.

Figure 2:
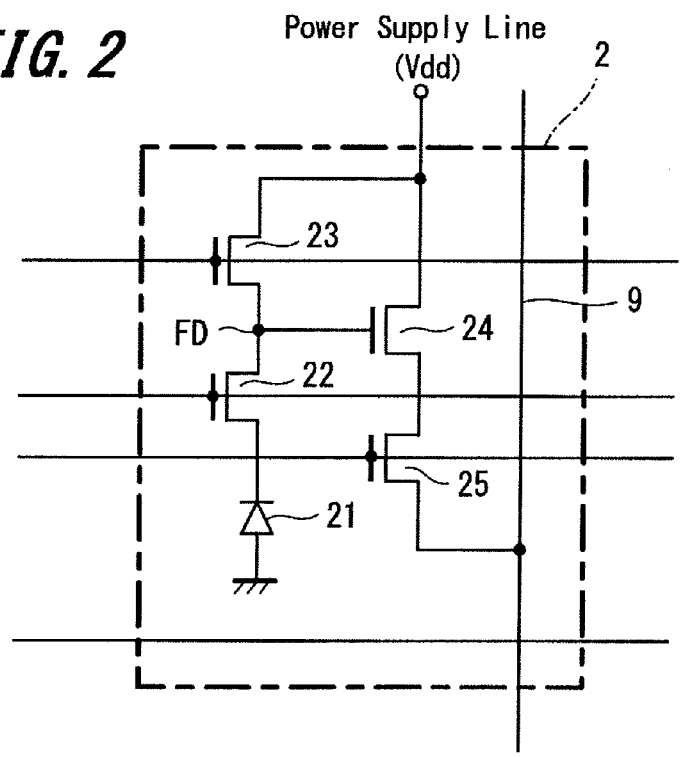
FIG. 2 is an equivalent circuit diagram showing an example of a unit pixel shown in FIG. 1.

FIG. 2 illustrates an equivalent circuit diagram showing an example of the pixel 2. The pixel 2 includes: a photodiode 21 forming a photoelectric converting portion, for example, and a MOS transistor forming a charge converting portion for converting a charge generated by photoelectric conversion in the photodiode 21 into a pixel signal. Specifically, the pixel 2 includes the photodiode 21 and a plurality of MOS transistors. The plurality of MOS transistors are n-channel MOS transistors and includes a transfer transistor 22 for transferring charges generated in the photodiode 21 into a floating diffusion portion FD, a reset transistor 23 for resetting electric potential of the floating diffusion portion FD, an amplification transistor for converting charges generated in the photodiode 21 into pixel signals and a selection transistor 25. The floating diffusion portion FD is formed by a drain region of the transfer transistor 22 as shown in a later described pixel cross-sectional structure.

The control circuit 8 generates a clock signal, a control signal, and so on to be referenced to operations of the vertical drive circuit 4, the column signal-processing circuit 5, the horizontal drive circuit 6, and so on based on a vertical synchronization signal, a horizontal synchronization signal and a master clock signal. Subsequently, the control circuit 8 inputs the signals into the vertical drive circuit 4, the column signal-processing circuit 5, the horizontal drive circuit 6, and so on, respectively.

The vertical drive circuit 4 includes, for example, a shift resister. The vertical drive circuit 4 selectively scans the respective pixels 2 in the imaging region 3 one-line at a time sequentially in a vertical direction. Then, through a vertical signal line 9, the vertical drive circuit 4 supplies the column signal-processing circuit 5 with a pixel signal generated in the photoelectric converting portion (photodiode) 21 of each pixel on the basis of signal charge in response to light intensity received.

The column signal-processing circuit 5 is arranged, for example, on each column of the pixels 2. The circuit 5 performs signal processing, such as noise cancellation and signal amplification on signals output from the pixels 2 in one line using signals from black standard pixels (although not shown in figures, they are formed around the effective pixel region). A horizontal selecting switch (not shown) is provided on an output stage of the column signal-processing circuit 5 to be connected between the circuit and the horizontal signal line 10.

The horizontal drive circuit 6 includes, for example, a shift resister and sequentially outputs horizontal scanning pulses to select the respective column signal-processing circuits 5 in order, thereby allowing each of the column signal-processing circuits 5 to output a pixel signal to the horizontal signal line 10.

The output circuit 7 performs signal processing on signals sequentially supplied from the respective column signal-processing circuits 5 through the horizontal signal line 10 and outputs thus processed signals.

Figure 3:
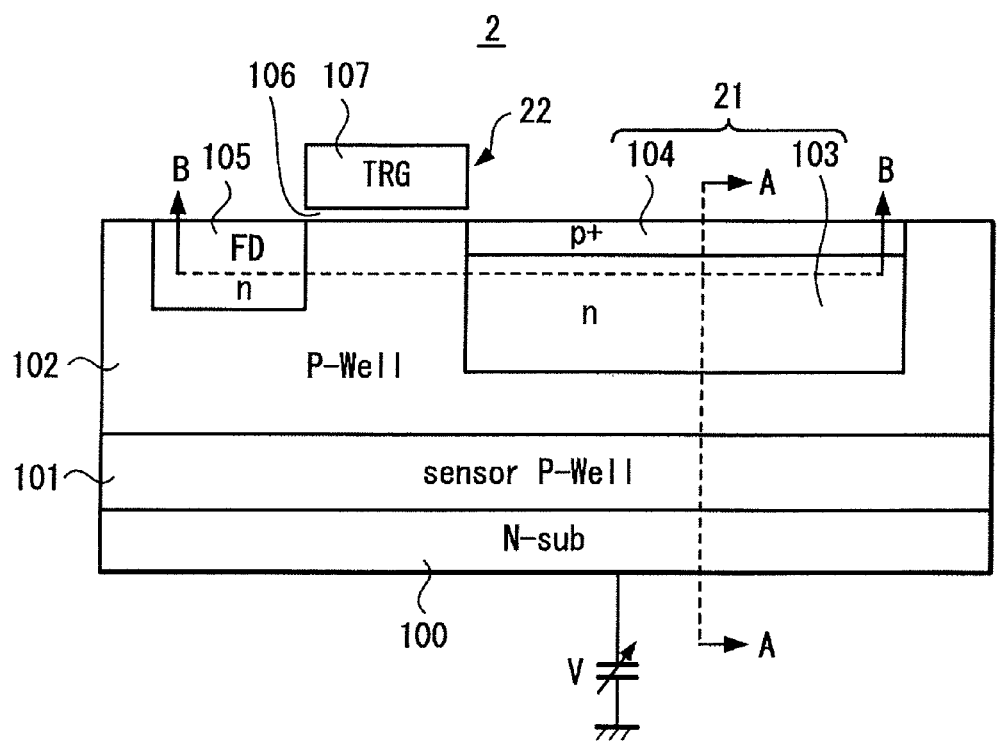
FIG. 3 is a cross-sectional view of a main portion showing an example of the unit pixel shown in FIG. 1.

FIG. 3 is a schematic cross-sectional view of a main portion of the pixel 2. The pixel 2 includes a first conductive type, in this example, n-type silicon substrate 100 on which a second conductive type, in this example, p-type first semiconductor well region (i.e., p-type sensor well region) 101 and a p-type second semiconductor well region 102 are formed. The photodiode (PD) 21 and the plurality of MOS transistors (the transfer transistor 22 alone is shown in FIG. 3) are formed on the p-type second semiconductor well region 102. The photodiode is formed as a HAD (Hole Accumulation Diode) sensor that includes an n-type semiconductor region 103 to accumulate charges and a $P^+$ accumulation layer 104 formed on the surface of the photodiode 21. The transfer transistor 22 includes an n-type semiconductor region (corresponding to the drain) 105 which becomes a floating diffusion (FD), an n-type semiconductor region 103 (corresponding to the source) of the photodiode 21 and a gate electrode 107 formed through a gate insulating film 106.

The p-type first semiconductor well region 101 is in low concentration ($p^-$) and the p-type second semiconductor well region 102 is in concentration ($p^+$) higher than that of the first semiconductor well region 101. The overflow barrier in the thickness direction of the substrate is adjusted based on the impurity concentration of the p-type first semiconductor well region 102.

It should be noted that a multilayer wiring layer is formed above the substrate 100 through an insulating interlayer; a color filter is formed on the multilayer wiring layer through a planarized film; and an on-chip microlens is formed on the color filter, although not shown.

First Embodiment

A solid-state imaging device according to the first embodiment of the present invention is the solid-state imaging device 1 shown in FIGS. 1 and 3, and further includes a control device, that is, a control circuit for controlling a substrate voltage V of the silicon substrate 100. In the solid-state imaging device, blooming can be suppressed by controlling the substrate voltage V using the control circuit. Specifically, the substrate voltage V is increased to reduce an overflow barrier threshold in the p-type first semiconductor well region 101. Thus, charges that exceed the overflow barrier threshold, in this example, electrons are discharged to the semiconductor substrate 100, thereby suppressing blooming.

An initial setting voltage is supplied to the semiconductor substrate 100 from the same power source as a CMOS analog/logic power source that is a power source for driving analog circuits and digital circuits which are peripheral circuits of the imaging region 3. According to the embodiment of the present invention, the overflow barrier threshold is reduced by increasing the substrate voltage using the initial setting voltage as a reference voltage, thereby controlling the blooming.

Figure 4:
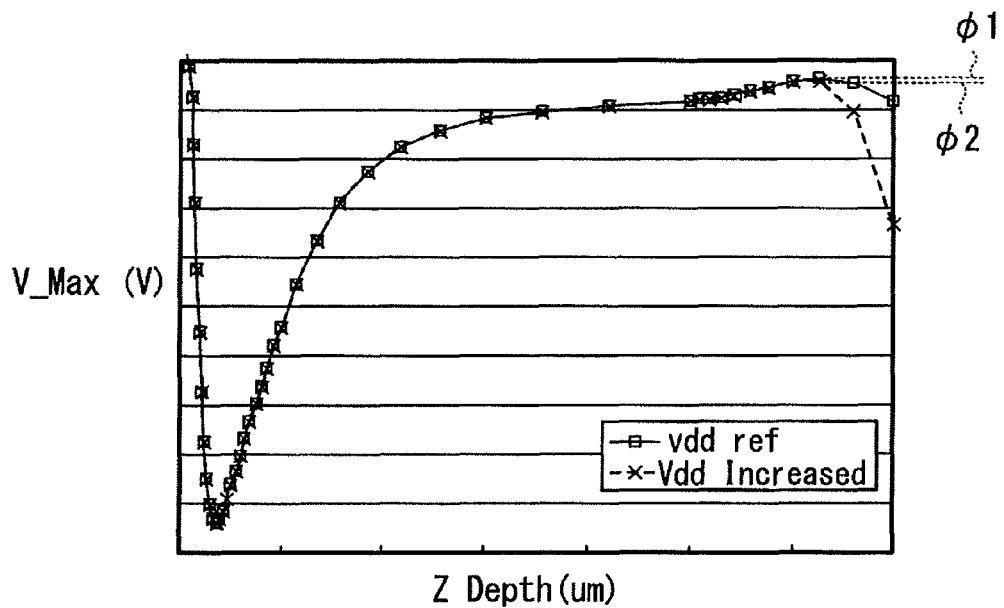
FIG. 4 is a potential distribution diagram showing a relationship between a substrate voltage and an overflow barrier for explaining an embodiment of the present invention.
Figure 5:
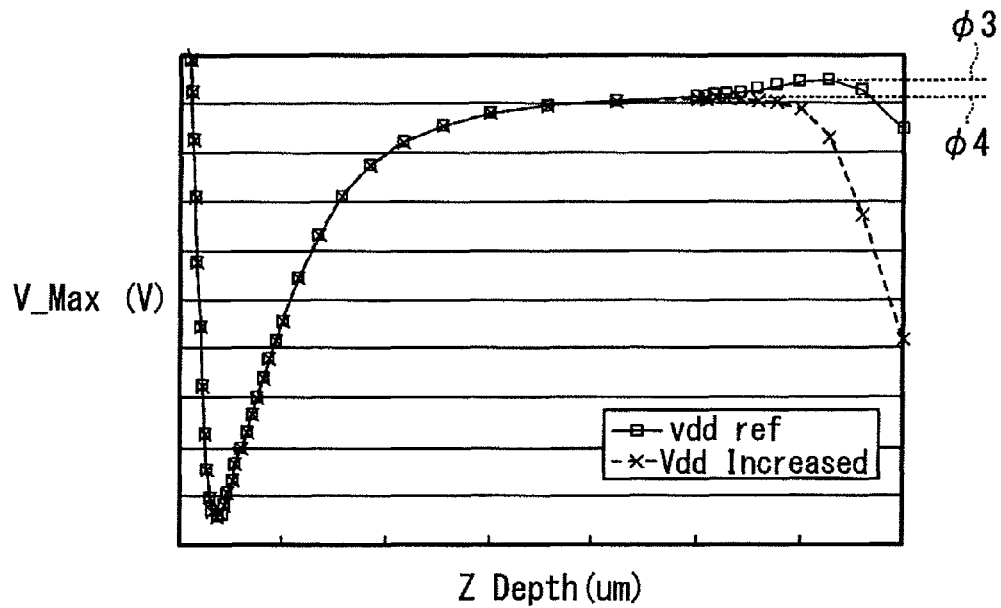
FIG. 5 is a potential distribution diagram showing a relationship between a substrate voltage and an overflow barrier for explaining an embodiment of the present invention.

FIGS. 4 and 5 are diagrams each showing a relationship between a substrate power supply of the n-type substrate 100 and an overflow barrier in the thickness direction of the substrate. Each of FIGS. 4 and 5 shows potential distribution on the line A-A in FIG. 3 (that is, line passing through the photodiode 21 and extended in the thickness direction of the substrate). FIG. 4 shows a potential distribution obtained in the case of high impurity concentration of the p-type first semiconductor well region 101 and FIG. 5 shows a potential distribution obtained in the case of low impurity concentration of the p-type first semiconductor well region 101.

Figure 6:
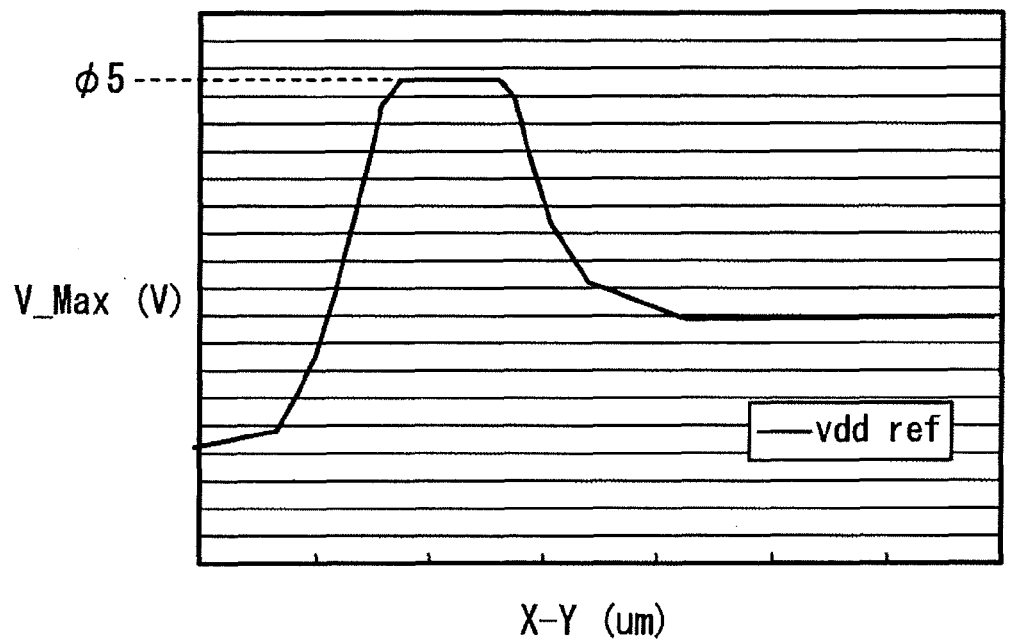
FIG. 6 is a potential diagram on a line B-B in FIG. 3.

Further, FIG. 6 is a cross-sectional potential diagram on the line B-B in FIG. 3 (that is, line passing through the photodiode 21, the gate portion and the floating diffusion portion in the lateral direction). FIG. 6 shows a potential obtained in the case of the gate portion being OFF state and electric potential $\phi 5$ generated below the gate portion is higher than overflow barriers $\phi 1$ to $\phi 4$ in FIGS. 4 and 5. According to the embodiment of the present invention, there is a difference between the value $\phi 5$ and the values $\phi 1$ to $\phi 4$, that is, there is a difference between the overflow barriers in the depth direction and the overflow barrier in the lateral direction. Hence, charges can substantially be prevented from being leaked into an adjacent pixel.

In the case where the substrate voltage V of a CMOS sensor is raised to approximately 10V to 15V equivalent to that of a CCD sensor from the CMOS analog/logic substrate power source (2V to 5V) typically applied to the CMOS sensor, for example, then the overflow barriers $\phi 1$ and $\phi 3$ are reduced to $\phi 2$ and $\phi 4$, respectively. The values $\phi 1$, $\phi 2$, $\phi 3$ and $\phi 4$ represent maximum overflow barriers at an inflection point of V_max. It should be noted that, if the concentration of the p-type first semiconductor well region 101 is high (see FIG. 4), an electric potential in the vicinity of the boundary between the p-type first semiconductor well region 101 and the n-type semiconductor substrate 100 increases. Therefore, a higher voltage should be applied to the semiconductor substrate 100 in order to reduce the overflow barrier.

Second Embodiment

A solid-state imaging device according to the embodiment of the present invention is the solid-state imaging device 1 shown in FIGS. 1 and 3, determines brightness of a subject and controls the substrate voltage in response to luminance determined, thereby suppressing blooming. For example, brightness (bright/dark) of a subject is determined with an AE (Automatic Exposure) incorporated in an image-capture camera and the substrate voltage V is changed in response to the luminance after adjusting an exposure time.

Figure 7:
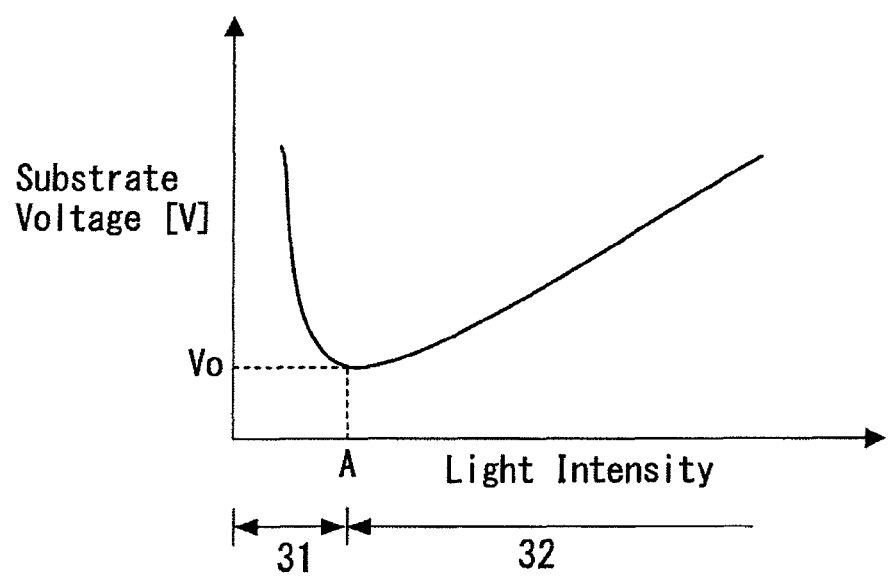
FIG. 7 is an explanatory diagram showing a relationship between an amount of light and a substrate voltage for explaining an embodiment of the present invention.
Figure 8:
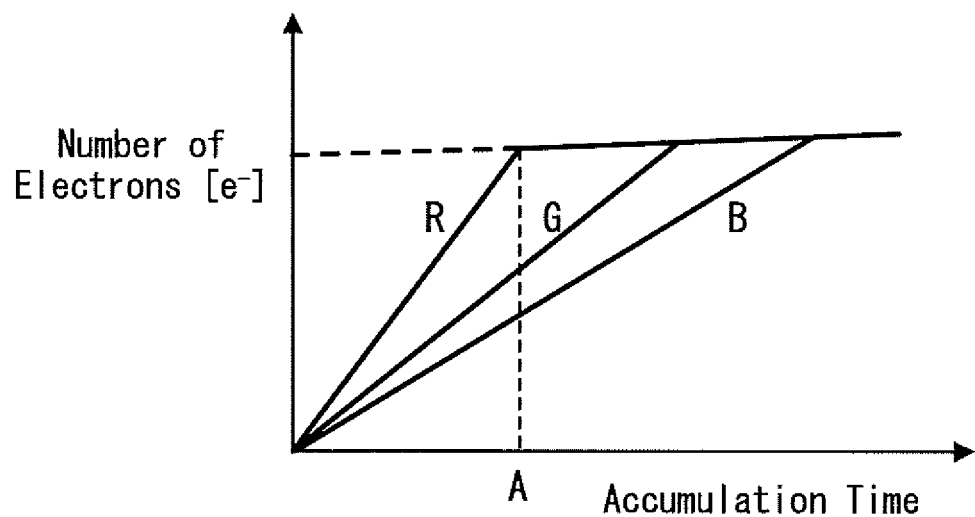
FIG. 8 is an explanatory diagram showing a relationship between the number of electrons and an accumulation time for explaining an embodiment of present invention.
Figure 9:
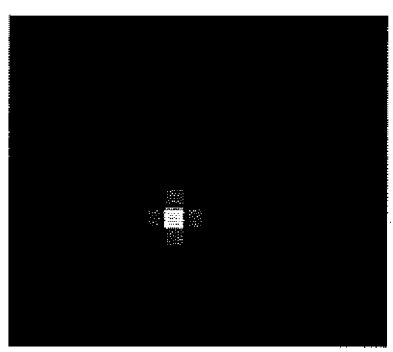
FIG. 9 is an explanatory diagram showing a bright spot in a dark field for explaining an embodiment of the present invention.

FIG. 7 is a diagram showing a relationship between an amount of light and a substrate voltage. FIG. 8 is a diagram showing a relationship between the number of electrons (amount of charges) and an amount of light. The AE determines brightness (bright/dark) to adjust the exposure time. In the case where it is determined that an average output from the effective pixel area is low and that the subject, an image of which is captured, is "dark" (an amount of light is smaller than A in FIG. 7 represented by an area 31), the overflow barrier is reduced by uniformly increasing the substrate power supply voltage. For example, the overflow barrier is reduced by increasing the substrate voltage in response to an image-capture mode. Specifically, if an image of a starlit sky (a bright spot in the darkness) is captured with a night scene mode using a CMOS sensor (see FIG. 9), the substrate power supply voltage is increased to reduce blooming from the bright portion to an adjacent pixel, thereby a clear image being obtained. Further, in the case where an amount of light is large (represented by an area 32 in FIG. 7), the overflow barrier is reduced by increasing the substrate power supply voltage using a control circuit, that is, a substrate voltage control circuit when the number of electrons is saturated (at the points A in FIGS. 7 and 8). Specifically, the substrate voltage is made higher than the initial setting voltage V0 (the same as the CMOS analog/logic voltage) shown in FIG. 7, thereby reducing the overflow barrier to suppress blooming.

As shown in FIG. 8, light of red (R), green (G) and blue (B) each has a different accumulation time at which the number of electrons is saturated. In the case where an amount of light is large, the control circuit is operated when the number of electrons of any color of light, that is, red (R) light in this embodiment reaches the saturated level before green (G) light and blue (B) light, thereby preventing colors from being mixed due to blooming.

The solid-state imaging device according to the embodiment may reduce the overflow barrier to control blooming only when capturing an image of a dark subject with an amount of light smaller than the amount A shown in FIG. 7. In that case, the substrate voltage is made higher than the initial setting voltage in response to luminance of the subject. Alternatively, the solid-state imaging device according to the embodiment may reduce the overflow barrier to suppress blooming by increasing the substrate voltage in response to brightness (bright/dark) of a subject regarding the whole area. The whole area includes the area (bright subject) with an amount of light larger than the light amount A and the area (dark subject) with an amount of light smaller than the light amount A shown in FIG. 7.

Third Embodiment

Figure 10:
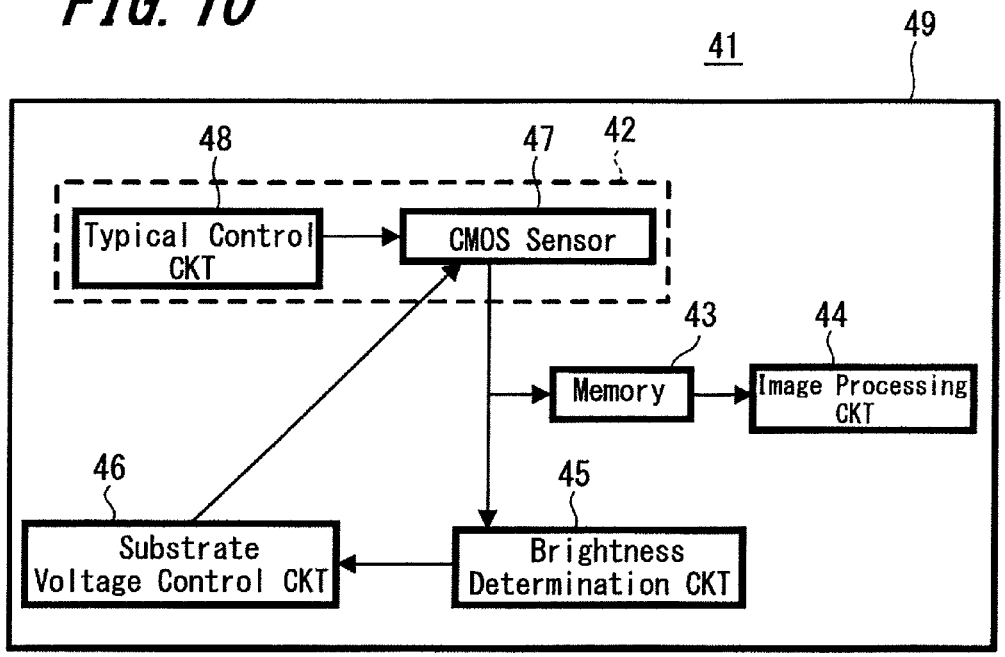
FIG. 10 is a block diagram showing an example of a solid-state imaging device provided with a control system according to an embodiment of the present invention.

FIG. 10 is a block diagram showing a configuration example of a solid-state imaging device including a control device (control system) according to an embodiment of the present invention. As shown in FIG. 10, a solid-state imaging device 41 according to the embodiment includes: a solid-state imaging device unit (corresponding to the solid-state imaging device 1 shown in FIG. 1) 42, a memory circuit 43, an image processing circuit 44, a brightness determination circuit 45, and a substrate voltage control circuit 46. The memory circuit 43 stores an output from the solid-state imaging device unit 42. The image processing circuit 44 processes a signal from the memory circuit 43 into an image. The brightness determination circuit 45 is a device that determines brightness of a subject based on the output from the solid-state imaging device unit 42. The substrate voltage control circuit 46 is a device that controls a substrate voltage based on a determination result of the brightness determination circuit 45. The solid-state imaging device unit 42 includes: a CMOS sensor portion 47 corresponding to the imaging region 3, the column signal-processing circuit 5, the horizontal signal line 10, the output circuit 7 and the like shown in FIG. 1 and a typical control circuit 48 corresponding to the vertical drive circuit 4, the horizontal drive circuit 6, the control circuit 8 and the like shown in FIG. 1. The solid-state imaging device 41 according to the embodiment may be formed of one chip 49.

According to the embodiment of the present invention, the memory circuit 43 temporarily stores a signal output from the solid-state imaging device unit 42. Subsequently, the image processing circuit 44 processes the signal output from the memory circuit 43 and outputs the result. Also, the signal output from the solid-state imaging device unit 42 is input into the brightness determination circuit 45 where the brightness, that is, luminance is determined in response to the output signal. The determination result is input into the substrate voltage control circuit 46 and a control signal corresponding to the luminance is output from the substrate voltage control circuit 46. The control signal obtained at the substrate voltage control circuit 46 is fed back to the substrate power supply and the substrate voltage of the solid-state imaging device unit 42 is controlled by controlling the substrate power supply voltage. As a result, the overflow barrier is controlled in response to luminance, thereby suppressing blooming. Since the substrate power supply is applied independently, the substrate voltage alone may be controlled.

Figure 11:
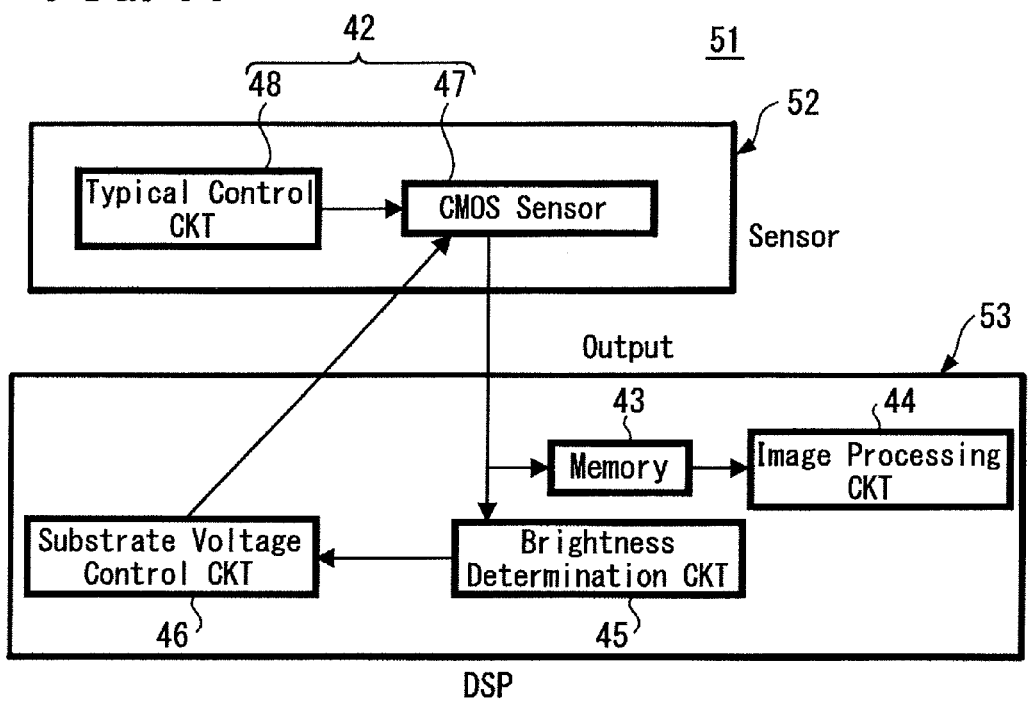
FIG. 11 is a block diagram showing an example of a solid-state imaging device provided with a control system according to another embodiment of the present invention.

FIG. 11 shows a modified example of a solid-state imaging device including a control device (control system). As shown in FIG. 11, a solid-state imaging device 51 according to the modified example is formed of two chips 52 and 53. One chip 52 includes a solid-state imaging device 42 including a CMOS sensor portion 47 and a typical control circuit 48. Another chip 53 includes a memory circuit 43, an image processing circuit 44, a brightness determination circuit 45 and a substrate voltage control circuit 46 that form a DSP (Digital Signal Processor). Control operations of the control device (control system) are similar to those of the above-described control system shown in FIG. 10 and are not described here.

Figure 12:
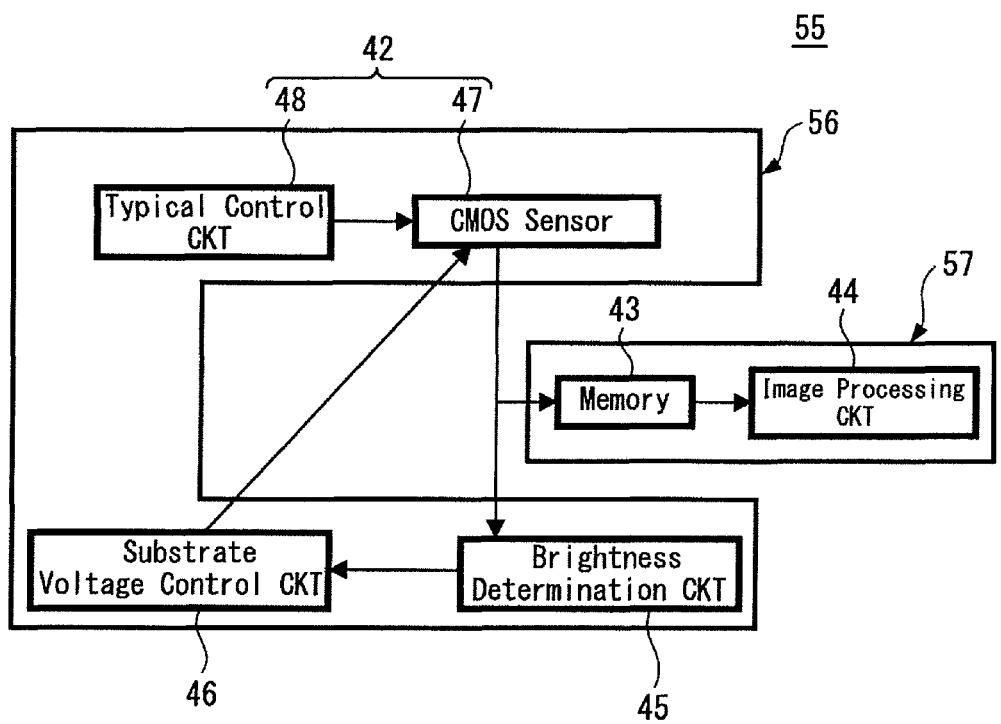
FIG. 12 is a block diagram showing an example of a solid-state imaging device provided with a control system according to further another embodiment of the present invention.

FIG. 12 shows another modified example of a solid-state imaging device including a control device (control system). As shown in FIG. 12, a solid-state imaging device 55 according to the modified example is formed of two chips 56 and 57. One chip 56 includes a solid-state imaging device unit 42 including the CMOS sensor portion 47 and the typical control circuit 48, the brightness determination circuit 45, and the substrate voltage control circuit 46. Another chip 57 includes the memory circuit 43 and the image processing circuit 44. Control operations of the control device (control system) are similar to those of the above-described control system shown in FIG. 10 and therefore are not described here.

Upon determining brightness, it is desirable that the amount of pixel signals be digitized so that brightness (light intensity) may be determined based on a resultant digital value. Specifically, a pixel signal may be digitized at a column ADC (A/D (analog-to-digital) converter), and brightness can be determined by the column ADC. The brightness may be determined readily with the digital value.

Each of the solid-state imaging devices 41, 51 and 55 may be combined with an optical lens system and used as a camera module or an electronic device module applied to an image-capture camera, or an electronic device having camera functions, for example.

In the case where the above-mentioned solid-state imaging devices 41, 51 and 55 are applied for capturing moving images, the brightness determination circuit 45 may determine an amount of light and control the substrate power supply voltage in response to brightness as follows. Specifically, in such case, an output of one frame located immediately before or several frames before, or a mean output of several frames (a plurality of frames) (and preferably, an output of one frame located immediately before the current frame) obtained from the solid-state imaging device unit 42 is used to determine the amount of light. When an amount of light is determined using the output of one frame immediately before, a time lag is smallest and displacement of the subject is small so that an amount of light is most similar to that of the current frame, thereby enabling brightness to be determined with high accuracy.

In the case where brightness (bright/dark) is determined using AE, brightness can be determined using a mean output of the whole effective pixel area, or a mean output of one divided area obtained by dividing the effective pixel area into a plurality of areas, or a mean output of a plurality of divided areas among those areas. Based on the determination result, the substrate power supply voltage may be controlled in response to luminance. It should be noted that an amount of light may be detected in the middle of scanning on one frame, that is, an amount of light in the first half of scanning may be detected and used to determine brightness.

In the case of a still image, since there is no displacement of the subject, brightness can accurately be determined using a mean output of a plurality of frames.

Two kinds of methods are known and each of them can be employed to determine an amount of light. A first method uses a certain reference value and determines an amount of light by comparing the amount of light with the reference value. A second method uses an amount of light of one frame before and determines a present amount of light by comparing each other's amount of light.

Fourth Embodiment

A solid-state imaging device according to the embodiment of the present invention detects a substrate current and controls a substrate voltage in response to the detected substrate current. Specifically, the substrate current is monitored and the substrate voltage is controlled by being increased when detecting the substrate current, thereby detecting that an amount of charge (number of electrons) in a certain pixel is saturated and overflows. The substrate current is a current caused by charges (electrons) flowing into the substrate. The substrate voltage will be changed when the substrate current is increased.

Fifth Embodiment

Figure 13:
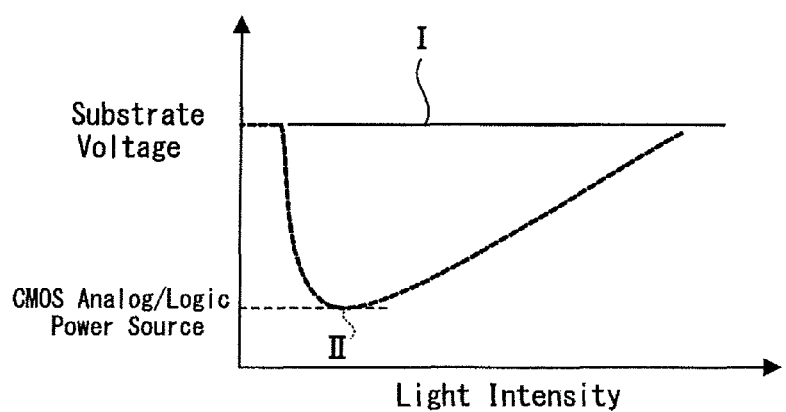
FIG. 13 is an explanatory diagram showing a relationship between an amount of light and a substrate voltage for explaining an embodiment of the present invention.

A solid-state imaging device according to the embodiment of the present invention uses a substrate power supply set to a voltage higher than that of the CMOS analog/logic power supply. In the case of a CMOS sensor, as mentioned hereinbefore, typically the power supply such as the CMOS analog/logic power supply and the substrate power supply may apply the same voltages (for example, 3.3V, 5.0V, etc.). As shown in FIG. 13, if the substrate power supply (voltage) is set in advance to be higher than a CMOS analog/logic power supply (voltage) II, for example, a voltage I of approximately a substrate power supply (10V to 15V) of the CCD sensor, blooming can be reduced.

According to the above-mentioned embodiments of the present invention, in the case where a difference between a bright portion and a dark portion is large such as a portion in proximity to a bright spot in a dark field or a dark spot in the bright field or an amount of charge (for example, number of electrons) is saturated, the substrate power supply voltage is increased to reduce the overflow barrier, thereby controlling blooming which causes color mixing. Hence, the difference between brightness and darkness in such images may become clear. Since an electric current is not applied, power consumption can be prevented from increasing when the substrate power supply voltage is increased.

A CMOS image sensor is manufactured by forming a CMOS transistor and a CMOS sensor portion at a time. Lately, the thickness of a gate oxide film is reduced to operate a MOS transistor at a higher speed and hence a power supply voltage tends to be lowered. Further, typically the CMOS analog/logic power supply and the substrate power supply may apply the same voltages (for example, 3.3V, 5.0V, etc.). If the power supply voltage is lowered, then the overflow barrier tends to increase as shown in FIGS. 4 and 5, which may cause blooming. However, according to the arrangements of the above-described embodiments, the substrate voltage is increased to reduce the overflow barrier, thereby controlling blooming. Such configuration may be efficient for lowering the power supply voltage.

It should be understood by those skilled in the art that various modifications, combinations, sub-combinations and alterations may occur depending on design requirements and other factors insofar as they are within the scope of the appended claims or the equivalents thereof.

What is claimed is:

1. A system to control a substrate voltage of a solid-state imaging unit, comprising:
   an image processing unit configured to process a signal output from the solid-state imaging unit;
   a brightness determination unit configured to determine a mean output of a plurality of pixel areas contained within the solid-state imaging unit; and
   a substrate voltage control unit configured to increase the substrate voltage of the solid-state imaging unit based on the determined mean output of the plurality of pixel areas.

2. A system to control a substrate voltage of a solid-state imaging unit, comprising:

an image processing unit configured to process a signal output from the solid-state imaging unit; and a substrate voltage control unit configured to control the substrate voltage of the solid-state imaging unit based on a comparison of a first brightness corresponding to a current frame of a captured image with a second brightness corresponding to a mean output of a plurality of frames before the current frame of the captured image.

3. The system for controlling the substrate voltage of the solid-state imaging unit of claim 1, wherein the brightness determination unit is further configured to determine the mean output of an entire pixel area.

4. The system for controlling the substrate voltage of the solid-state imaging unit of claim 1, wherein the solid-state imaging unit is separate from the image processing unit.

5. The system for controlling the substrate voltage of the solid-state imaging unit of claim 1, wherein the brightness determination unit is configured to determine the mean output of a portion of the plurality of pixel areas.

6. The system for controlling the substrate voltage of the solid-state imaging unit of claim 2, wherein the solid-state imaging unit is separate from the image processing unit.

7. The system for controlling the substrate voltage of the solid-state imaging unit of claim 1, wherein the substrate voltage control unit is further configured to increase the substrate voltage of the solid-state imaging unit from an initial setting voltage based on a selection of a night scene image capture mode, wherein the selection is based on an amount of light determined lower than a reference amount of light.

8. The system for controlling the substrate voltage of the solid-state imaging unit of claim 2, further comprising a brightness determination unit configured to determine brightness of a subject whose image is captured.

* * * * *